(12) United States Patent
Matsuura

(10) Patent No.: US 11,576,267 B2
(45) Date of Patent: Feb. 7, 2023

(54) ULTRA-THIN COPPER FOIL, ULTRA-THIN COPPER FOIL WITH CARRIER, AND METHOD FOR MANUFACTURING PRINTED WIRING BOARD

(71) Applicant: MITSUI MINING & SMELTING CO., LTD., Tokyo (JP)

(72) Inventor: Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 209 days.

(21) Appl. No.: 16/758,939

(22) PCT Filed: Oct. 18, 2018

(86) PCT No.: PCT/JP2018/038877
§ 371 (c)(1),
(2) Date: Apr. 24, 2020

(87) PCT Pub. No.: WO2019/082795
PCT Pub. Date: May 2, 2019

(65) Prior Publication Data
US 2021/0127503 A1 Apr. 29, 2021

(30) Foreign Application Priority Data
Oct. 26, 2017 (JP) .............................. JP2017-207151

(51) Int. Cl.
*H05K 3/46* (2006.01)
*H05K 1/09* (2006.01)
*H05K 3/06* (2006.01)

(52) U.S. Cl.
CPC ............. *H05K 3/4658* (2013.01); *H05K 1/09* (2013.01); *H05K 3/062* (2013.01); *H05K 3/067* (2013.01);
(Continued)

(58) Field of Classification Search
CPC .......... H05K 1/09; H05K 3/062; H05K 3/067; H05K 3/4658; H05K 2203/0353; H05K 2203/0384
See application file for complete search history.

(56) References Cited

U.S. PATENT DOCUMENTS 7,026,059 B2 * 4/2006 Suzuki .................... B32B 15/08
428/626
9,006,103 B2 * 4/2015 Kobayashi .......... H01L 21/4857
438/622
(Continued)

FOREIGN PATENT DOCUMENTS

JP 2002-289749 A 10/2002
JP 2005-76091 A 3/2005
(Continued)

OTHER PUBLICATIONS

ISR for PCT/JP2018/038877, dated Jan. 8, 2019.
Written Opinion for PCT/JP2018/038877, dated Jan. 8, 2019.

*Primary Examiner* — Carl J Arbes
(74) *Attorney, Agent, or Firm* — Greenblum & Bernstein, P.L.C.

(57) ABSTRACT

An extremely thin copper foil is provided that enables formation of highly fine different wiring patterns with a line/space (L/S) of 10 μm or less/10 μm or less on two sides of the copper foil and is thus usable as an inexpensive and readily processable substitution for silicon and glass interposers. The extremely thin copper foil includes, in sequence, a first extremely thin copper layer, an etching stopper layer, and the second extremely thin copper layer. Two sides of the extremely thin copper foil each have an arithmetic average roughness Ra of 20 nm or less.

13 Claims, 4 Drawing Sheets

(52) U.S. Cl.
CPC ............... *H05K 2203/0353* (2013.01); *H05K 2203/0384* (2013.01)

(56) References Cited

U.S. PATENT DOCUMENTS

| | | | |
|---|---|---|---|
| 10,356,915 B2 * | 7/2019 | Matsuura | H05K 3/4688 |
| 10,492,308 B2 * | 11/2019 | Matsuura | H01L 23/15 |
| 10,886,146 B2 * | 1/2021 | Matsuura | H05K 3/025 |
| 10,888,003 B2 * | 1/2021 | Matsuura | B32B 7/06 |
| 2009/0294401 A1 | 12/2009 | Chen | |
| 2013/0220679 A1 * | 8/2013 | Kawakami | H05K 3/025 |
| | | | 428/606 |
| 2016/0381796 A1 | 12/2016 | Lee et al. | |

FOREIGN PATENT DOCUMENTS

| | | | | |
|---|---|---|---|---|
| JP | 2005-101137 | A | * | 4/2005 |
| JP | 2005-340372 | A | | 12/2005 |
| JP | 2006-253347 | A | | 9/2006 |
| JP | 2009-88572 | A | | 4/2009 |
| JP | 4726855 | B | * | 7/2011 |
| JP | 2017-17307 | A | | 1/2017 |
| JP | 2017-114070 | A | | 6/2017 |
| WO | 2017/141983 | | * | 8/2017 |
| WO | 2017/141985 | | * | 8/2017 |
| WO | 2017/150283 | | * | 9/2017 |
| WO | 2017/150284 | | * | 9/2017 |
| WO | WO 2017/150283 | A1 | | 9/2017 |
| WO | WO 2017/150284 | A1 | | 9/2017 |

* cited by examiner

ULTRA-THIN COPPER FOIL, ULTRA-THIN COPPER FOIL WITH CARRIER, AND METHOD FOR MANUFACTURING PRINTED WIRING BOARD

TECHNICAL FIELD

The present invention relates to an extremely thin copper foil, an extremely thin copper foil with a carrier, and a method of manufacturing a printed circuit board.

BACKGROUND ART

Printed circuit boards with finer wiring patterns (finer pitches) have been required as electronic devices, such as mobile electronic devices, are compact and advanced. In order to meet such a request, preferred are copper foils for manufacture of printed circuit boards that have smaller thicknesses and lower surface roughnesses. For example, Patent Literature 1 (JP2005-76091A) discloses a method of manufacturing an extremely thin copper foil with a carrier, including laminating a release layer and an extremely thin copper foil in sequence on a smooth surface of a carrier copper foil, where the average surface roughness Rz of the carrier copper foil is reduced to 0.01 to 2.0 μm. Patent Literature 1 also discloses subjecting the extremely thin copper foil with a carrier to a process for formation of a highly dense ultrafine trace (a fine pattern) to produce a multi-layered printed circuit board.

In order to achieve further reductions in thicknesses and surface roughnesses of extremely thin copper foils with carriers, formation of an extremely thin copper layer by a gas-phase process, for example, a sputtering process, has been proposed. For example, Patent Literature 2 (WO2017/150283) discloses a copper foil with a carrier, including, in sequence, a carrier, a release layer, an antireflective layer, and an extremely thin copper layer, where the release layer, the antireflective layer, and the extremely thin copper layer are formed by sputtering. Patent Literature 3 (WO2017/150284) discloses a copper foil with a carrier, including a carrier, intermediate layers (for example, an adhesive metal layer and a release assisting layer), a release layer, and an extremely thin copper layer, where the intermediate layers, the release layer, and the extremely thin copper layer are formed by sputtering. Both Patent Literatures 2 and 3 achieve a significantly low arithmetic average roughness Ra of 1.0 to 100 nm of the outer surface of the extremely thin copper layer through formation of the layers on the carrier (composed of, for example, glass) by sputtering.

It is known that an etching stopper layer is provided on a metal layer to prevent exposure of an insulating film to an etching solution during production of multi-layered circuits by etching. For example, Patent Literature 4 (JP2009-88572A) discloses a metal sheet including, in sequence, a metal layer for formation of a wiring film (for example, a cupper foil having a thickness of 12 μm), an etching stopper layer (for example, a Ni layer having a thickness of 1 μm), and another metal layer for formation of bumps (for example, a cupper foil having a thickness of 80 μm), where the etching stopper layer can prevent etching of the metal layer for formation of the wiring film during selective etching of the metal layer for formation of bumps.

CITATION LIST

Patent Literature

[Patent Literature 1] JP2005-76091A
[Patent Literature 2] WO2017/150283
[Patent Literature 3] WO2017/150284
[Patent Literature 4] JP2009-88572A

SUMMARY OF INVENTION

A packaging technique called two-and-a-half-dimensional (2.5D) implementation has been developed for achieving high-density packaging of semiconductor components and their high processing rates. In the 2.5D implementation, a silicon interposer as an intermediate substrate is provided between an integrated circuit (IC) chip and a package substrate. The silicon interposer intermediates the IC chip and the package substrate which have different terminal pitches. In other words, the silicon interposer serves as a rewiring substrate in the 2.5D implementation. In detail, an upper electrode and a lower electrode of the silicon interposer are electrically connected by a through-silicon via (TSV) formed in the silicon interposer. Highly dense trace layers are formed on the silicon interposer and connect electrodes on the uppermost layer of the silicon interposer and the IC chip via microbumps. The silicon interposer and the package substrate are also connected via other bumps. The IC chip and the package substrate can be thereby intermediated. The silicon interposer has a high tolerance for processing. The silicon interposer is less affected by moisture and coefficients of thermal expansion (CTE), and thus enables formation of a significantly reliable and highly fine wiring pattern, which has been difficult in a traditional resin substrate. Another technique has also been developed that uses a glass interposer instead of a silicon interposer in view of physical and electric characteristics.

Unfortunately, the silicon interposer and the glass interposer are expensive. In addition, process costs, for example, for formation of a through-silicon via or a through-glass via (TGV) are also significantly high. Thus, rewiring techniques using silicon interposers or glass interposers are employed in only limited fields, for example, high-performance computing fields that can accept high manufacturing costs. Hence, an inexpensive and readily processable material is preferred that can substitute for the silicon and glass interposers. Each of the traditional copper foils disclosed in Patent Literatures 1 to 4 is designed to form a circuit only on one side and thus unsuitable for formation of different wiring patterns on two sides, unlike the silicon and glass interposers.

The present inventor has discovered that by forming a three-layer structure including a first extremely thin copper layer, an etching stopper layer, and a second extremely thin copper layer in which two sides each have an arithmetic average roughness Ra of 20 nm or less, it is possible to provide an extremely thin copper foil that enables formation of highly fine different wiring patterns with a line/space (L/S) of 10 μm or less/10 μm or less on the two sides and is thus usable as an inexpensive and readily processable substitution for silicon and glass interposers.

An object of the present invention is to provide an extremely thin copper foil that enables formation of highly fine different wiring patterns with a line/space (US) of 10 μm or less/10 μm or less on two sides of the copper foil and is thus usable as an inexpensive and readily processable substitution for silicon and glass interposers.

According to an aspect of the present invention, there is provided an extremely thin copper foil comprising, in sequence:
a first extremely thin copper layer;
an etching stopper layer; and
a second extremely thin copper layer, wherein two sides of the extremely thin copper foil each have an arithmetic average roughness Ra of 20 nm or less.

According to another aspect of the present invention, there is provided an extremely thin copper foil with a carrier, comprising:
 a carrier composed of glass or ceramic;
 an adhesive metal layer provided on the carrier, the adhesive metal layer being composed of at least one metal selected from the group consisting of Ti, Cr, Mo, Mn, W, and Ni;
 a release layer provided on the adhesive metal layer, the release layer composed of a carbon layer; and
 the extremely thin copper foil provided on the release layer, wherein the second extremely thin copper layer is in contact with the release layer.

According to another aspect of the present invention, there is provided a method of producing a printed circuit board, comprising the steps of:
 providing the extremely thin copper foil with the carrier;
 forming a first circuit pattern by processing the first extremely thin copper layer;
 sealing the first circuit pattern with an insulating resin;
 releasing the carrier together with the adhesive metal layer and the release layer for exposure of the second extremely thin copper layer;
 forming a second circuit pattern by processing the second extremely thin copper layer and then processing the etching stopper layer; and
 sealing the second circuit pattern with an insulating resin.

DESCRIPTION OF EMBODIMENTS

Extremely Thin Copper Foil

Figure 1:
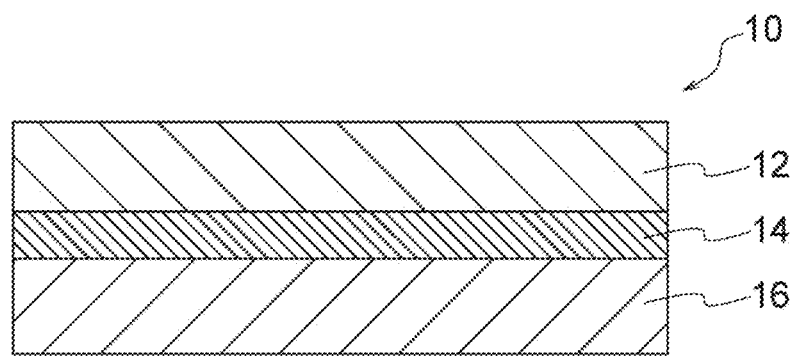
FIG. 1 is a schematic cross-sectional view illustrating one embodiment of an extremely thin copper foil according to the present invention.
Figure 3:
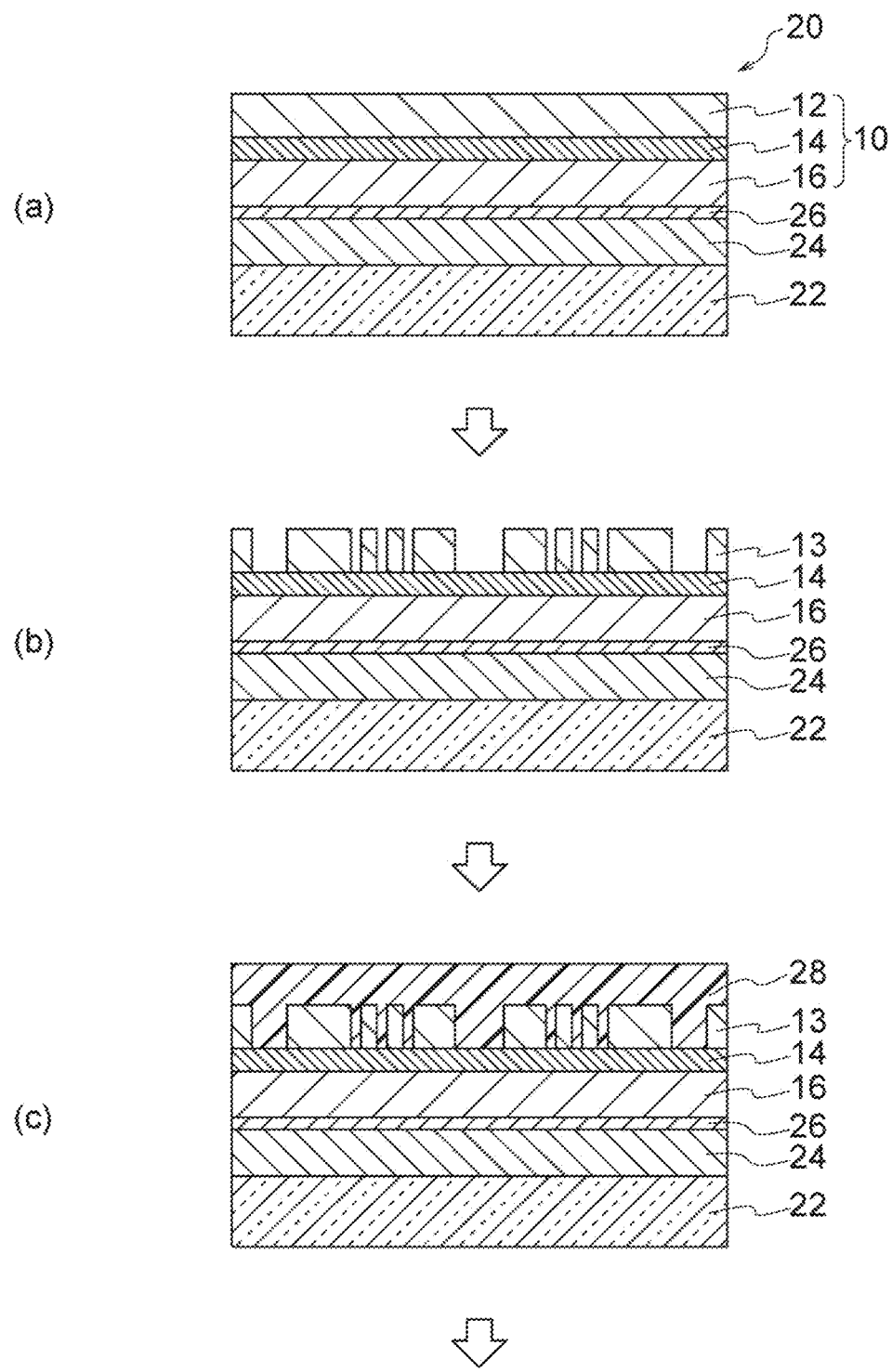
FIG. 3 is a flow chart showing the first half steps (Steps (a) to (c)) of a method of manufacturing a printed circuit board according to the invention.
Figure 4:
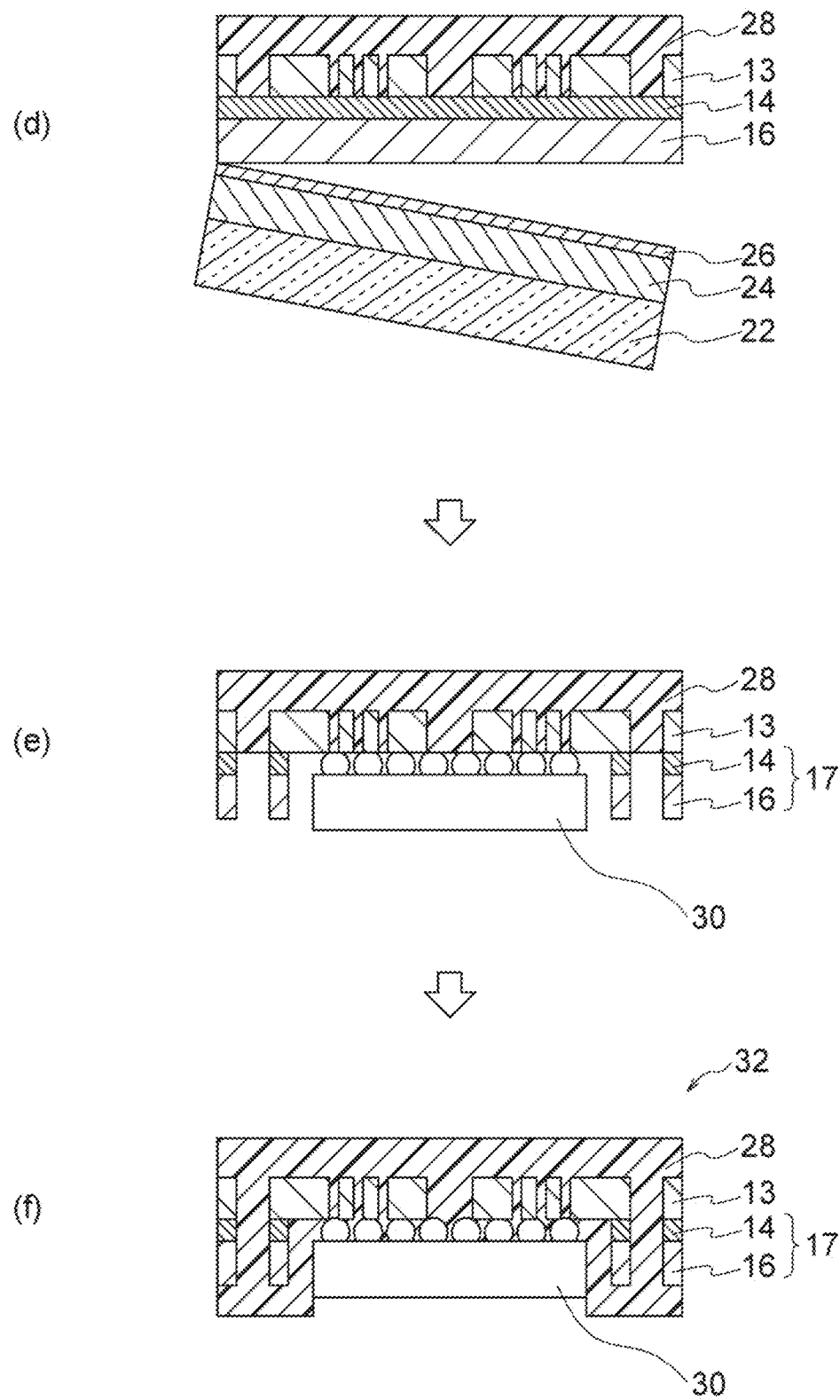
FIG. 4 is a flow chart showing steps in the second half (Steps (d) to (f)) of the method of manufacturing the printed circuit board according to the invention.

FIG. 1 schematically illustrates an extremely thin copper foil of the present invention. As illustrated in FIG. 1, an extremely thin copper foil 10 of the invention includes, in sequence, a first extremely thin copper layer 12, an etching stopper layer 14, and a second extremely thin copper layer 16. Two sides of the extremely thin copper foil 10 each have an arithmetic average roughness Ra of 20 nm or less. By forming a three-layer structure including the first extremely thin copper layer 12, the etching stopper layer 14, and the second extremely thin copper layer 16 in which two sides each have an arithmetic average roughness Ra of 20 nm or less, it is possible to provide the extremely thin copper foil 10 that enables formation of highly fine different wiring patterns with a line/space (L/S) of 10 μm or less/10 μm or less on the two sides and is thus usable as an inexpensive and readily processable substitution for silicon and glass interposers. In other words, the extremely thin copper foil 10 of the present invention is prepared and the first extremely thin copper layer 12 is processed for formation of a first circuit pattern 13 as illustrated in FIGS. 3 and 4. The second extremely thin copper layer 16 and the etching stopper layer 14 are then processed for formation of a second circuit pattern 17. Different wiring patterns can be thereby formed on the two sides because the etching stopper layer 14, which intervenes between the first and second extremely thin copper layers 12 and 16, prevents an etching solution from corroding the second extremely thin copper layer 16 during etching of the first extremely thin copper layer 12 on a remote side for formation of the first circuit pattern 13 and prevents the etching solution from corroding the first circuit pattern 13 during etching of the second extremely thin copper layer 16 on another remote side for formation of the second circuit pattern 17. The extremely thin copper foil 10 having an arithmetic average roughness Ra of 20 nm or less on the two sides can improve formation of a fine circuit pattern and enables formation of a highly fine wiring pattern having a line/space (US) of 10 μm or less/10 μm or less, which could have achieved only by silicon and glass interposers. The extremely thin copper foil 10, which is mainly composed of copper layers, is much less expensive and more readily processable than the silicon and glass interposers that are expensive, hard and thus difficult to be processed. Hence, the extremely thin copper foil 10 provides a superior substitution for the silicon and glass interposers.

The first extremely thin copper layer 12 and the second extremely thin copper layer 16 are composed of copper. The copper constituting the first extremely thin copper layer 12 and the second extremely thin copper layer 16 may contain incidental impurities originated from, for example, components contained a material and formed during a process for formation of the layers. The first extremely thin copper layer 12 and the second extremely thin copper layer 16 may be produced by any process, for example, a wet process, such as electroless copper plating process or electrolytic copper plating process, a physical vapor deposition process, such as a sputtering or vacuum vapor deposition process, a chemical vapor deposition process, or combination thereof. Particularly preferred extremely thin copper layers are formed by a gas-phase process, such as sputtering or vacuum vapor deposition, from the viewpoint of production of fine-pitch circuit patterns through thinning of the copper foil. Most preferred are extremely thin copper layers formed by a sputtering process. The extremely thin copper layers are preferably unroughened. Alternatively, the extremely thin copper layer may be roughened by preliminary roughening, soft etching, rinsing, or oxidation-reduction within a scope not precluding the formation of a wiring pattern during manufacturing of a printed circuit board. The first extremely thin copper layer 12 and the second extremely thin copper layer 16 preferably each have a thickness of 0.05 to 1.0 μm, more preferably 0.10 to 0.8 μm, further preferably 0.15 to 0.6 μm, particularly preferably 0.2 to 0.5 μm, most preferably 0.25 to 0.35 μm. Such a thickness is suitable for formation of a highly fine wiring pattern having a line/space (US) of 10 μm or less/10 μm or less. The extremely thin copper layer having a thickness in such a range is preferably formed by a sputtering process from the viewpoint of the uniformity of the thickness of the formed layer and production of a sheeted or rolled copper foil.

The etching stopper layer 14 is barely etched by a copper flash etching solution compared to the first and second extremely thin copper layers 12 and 16. In other words, the etching stopper layer 14 is characterized by its etching rate that is lower than that of copper. The etching rate is determined as follows: a foil sample composed of the same material as the etching stopper layer 14 and a reference copper foil sample are subjected to a copper etching process for an identical time. A decrease in weight of each sample is measured and is converted into a decrease in thickness from the density of the metal in each sample. Any known copper flash etching solution may be employed, which can dissolve copper through an oxidation-reduction reaction. Examples of the copper flash etching solution include aqueous sodium persulfate solutions, aqueous potassium persulfate solutions, and aqueous solutions of sulfuric acid and hydrogen peroxide. The temperature for etching can be appropriately determined within a range of 25 to 70° C.

The etching stopper layer 14 is preferably composed of a metal or alloy that is barely etched by a copper flash etching solution compared to the first and second extremely thin copper layers 12 and 16. Preferred examples of the metal and alloy constituting the etching stopper layer 14 include Al, Nb, Zr, Cr, W Ta, Co, Ti, Ag, Ni, Mo, and combination thereof from the viewpoint of tight adhesion between the first and second extremely thin copper layers 12 and 16. More preferred examples of the metal and alloy include Cr, Ta, Ti, Ni, Mo, and combination thereof. Further preferred examples of the metal and alloy includes Cr, Ti, Mo. and combination thereof. The most preferred examples of the metal and alloy include Ti, Mo, and the combination thereof. These elements are insoluble in a copper flash etching solution, resulting in a high chemical resistance against the copper flash etching solution. The etching stopper layer 14 preferably has a thickness of 0.05 to 1.0 μm, more preferably 0.08 to 0.8 μm, further preferably 0.10 to 0.6 μm, particularly preferably 0.12 to 0.45 μm, most preferably 0.15 to 0.35 μm. Such a thickness can respond to a request for thinning of a copper foil while preventing corrosion of the second extremely thin copper layer 16 during etching of the first extremely thin copper layer 12 and corrosion of the first circuit pattern 13 during etching of the second extremely thin copper layer 16. The etching stopper layer having a thickness in such a range is preferably formed by a sputtering process from the viewpoint of the uniformity of the thickness of the formed layer and production of a sheeted or rolled foil.

The extremely thin copper foil 10 preferably has a thickness of 0.15 to 3.0 μm, more preferably 0.28 to 2.4 μm, further preferably 0.4 to 1.8 μm, particularly preferably 0.52 to 1.45 μm, most preferably 0.65 to 1.05 μm. As long as the extremely thin copper foil 10 including, in sequence, the first extremely thin copper layer 12, the etching stopper layer 14, and the second extremely thin copper layer 16, has its own intrinsic function, the extremely thin copper foil 10 may include any other layer in addition to these three layers.

An arithmetic average roughness Ra is measured on two sides of the extremely thin copper foil 10 (in other words, a surface, remote from the etching stopper layer 14, of the first extremely thin copper layer 12 and another surface, remote from the etching stopper layer 14, of the second extremely thin copper layer 16) in accordance with JIS B 0601-2001. The two sides of the extremely thin copper foil 10 each have an arithmetic average roughness Ra of 20 nm or less, preferably 0.1 to 20 nm, more preferably 0.25 to 18 nm, further preferably 0.5 to 15 nm, particularly preferably 1.0 to 13 nm, most preferably 2.0 to 10 nm. As the arithmetic average roughness decreases, the extremely thin copper foil 10 becomes more suitable for production of a printed circuit board having a highly fine wiring pattern with a line/space (LS) of 10 μm or less/10 μm or less (for example, 10 μm/10 μm to 2 μm/2 μm). The arithmetic average roughness Ra may have any lower limit, for example, may be zero. In view of efficient planarization of a carrier 22 to be described below, an approximate indication of the lower limit of the arithmetic average roughness Ra is 0.1 nm. Since the arithmetic average roughness Ra of the carrier 22 affects the roughenesses of the two sides of the extremely thin copper foil 10, an adjustment of planarization of the carrier 22 can control the arithmetic average roughnesses Ra of the two sides of the extremely thin copper foil 10.

The first extremely thin copper layer 12, the etching stopper layer 14, and the second extremely thin copper layer 16 are preferably sputtered films or formed by a sputtering process. Formation of all of the first extremely thin copper layer 12, the etching stopper layer 14, and the second extremely thin copper layer 16 by the sputtering process significantly enhances production efficiency. Furthermore, the sputtering process commonly involves formation of a film with a highly pure target in vacuum. Thus, two sides of the extremely thin copper foil 10 can be kept in a clean state with a significantly low level of impurities. As a result, close contact can be achieved between a photoresist and the extremely thin copper foil 10 during formation of a circuit pattern. If the extremely thin copper foil is provided with a glass or ceramic carrier, a significant planarity of the carrier can be inherited by each layer. Thus, a low arithmetic average roughness Ra of 20 nm or less can be advantageously achieved on two sides of the extremely thin copper foil 10, resulting in more precise formation of a finer circuit pattern having a line/space (US) of 10 μm or less/10 μm or less with a photoresist.

Extremely Thin Copper Foil with Carrier

Figure 2:
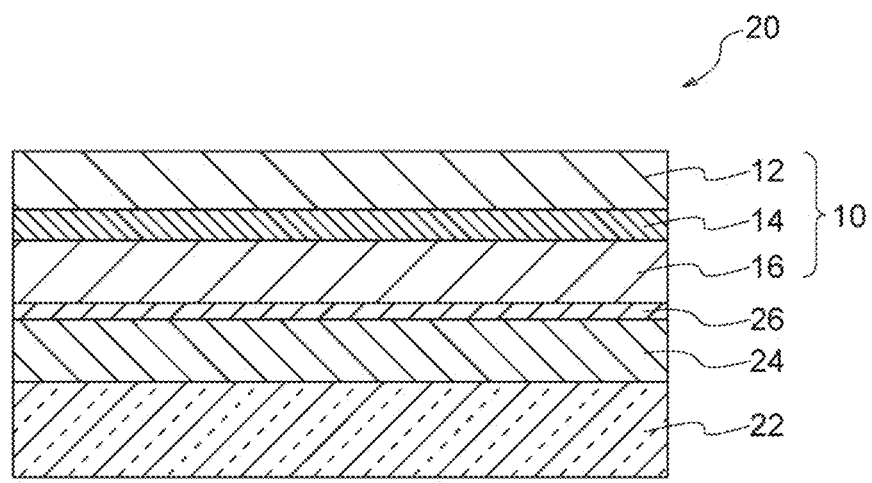
FIG. 2 is a schematic cross-sectional view illustrating one embodiment of the extremely thin copper foil with a carrier according to the invention.

The extremely thin copper foil of the present invention is preferably provided in the form of an extremely thin copper foil with a carrier from the viewpoint of enhanced handling and production of a printed circuit board (specifically, formation of circuit patterns on two sides of the extremely thin copper foil). FIG. 2 schematically illustrates a preferred embodiment of an extremely thin copper foil with a carrier according to the present invention. The extremely thin copper foil with the carrier 20 in FIG. 2 includes, in sequence, a carrier 22, an adhesive metal layer 24, a release layer 26, and the extremely thin copper foil 10 mentioned above. The carrier 22 is composed of glass or ceramic. The adhesive metal layer 24 is composed of at least one metal selected from the group consisting of Ti, Cr, Mo, Mn, W, and Ni and provided on the carrier 22. The release layer 26 is composed of a carbon layer and is provided on the adhesive metal layer 24. The extremely thin copper foil 10 is provided on the release layer 26 such that the second extremely thin copper layer 16 is in contact with the release layer 26. The aforementioned layers may be provided in sequence on two sides of the carrier 22 so as to be symmetrical about the carrier 22, as desired. The extremely thin copper foil with the carrier 20 may have any layered structure provided that the extremely thin copper foil 20 with a carrier includes the extremely thin copper foil 10, the carrier 22, the adhesive metal layer 24, and the release layer 26.

The carder 22 is composed of glass or ceramic. The carrier 22 may be anyone of a sheet, a film, and a plate. The carrier 22 may be a laminate of such a sheet, a film, and a plate. For example, the carrier 22 preferably serves as a rigid support, for example, a glass plate or a ceramic plate. Preferred examples of a ceramic constituting the carrier 22 include alumina, zirconia, silicon nitride, aluminum nitride, and other types of fine ceramics. A material is more preferred that has a coefficient of thermal expansion (CTE) of less than 25 ppm/K (typically 1.0 to 23 ppm/K) from the viewpoint of prevention of warping of the extremely thin copper foil with the carrier 20 in a process involving heating. Examples of such a material include ceramic and glass as mentioned above. From the viewpoint of ensuring of handling and planarization of the carrier during implementation of a chip, the carrier 22 preferably has a Vickers hardness of 100 HV or more, more preferably 150 to 2500 HV. A particularly preferred carrier 22 is composed of a material satisfying these properties, namely glass, for example, in the form of a glass plate or a glass sheet. The carrier 22 composed of glass has a low weight, a low coefficient of thermal expansion, and high insulation properties, high rigidity, and surface planarity, and thus is advantageous in that two sides of the extremely thin copper foil 10 can be significantly planarized. The carrier 22 composed of glass has other advantages, for example, coplanarity that is beneficial to formation of a fine circuit pattern; chemical resistance in desmearing in a manufacturing process of a printed circuit board and various plating processes; and employment of a chemical separation process during release of a carrier from the extremely thin copper foil with the carrier. Preferred examples of the glass of the carrier 22 include fused quartz, borosilicate glass, alkali-free glass, soda-lime glass, aluminosilicate glass, and combination thereof. More preferred examples of the glass constituting the carrier 22 include alkali-free glass, soda-lime glass, and combination thereof. A particularly preferred example of the glass of the carrier 22 is alkali-free glass. Alkali-free glass is mainly composed of silica dioxide, aluminum oxide, boric oxide, and alkaline-earth metal oxide, such as calcium oxide or barium oxide, and further contains boric acid. Thus, the alkali-free glass substantially contains no alkali metal. The alkali-free glass has a coefficient of thermal expansion that ranges from 3 to 5 ppm/K in a wide temperature range of 0° C. to 350° C. and is low and stable. Thus, the alkali-free glass has an advantage of minimization of warpage of glass in a process involving heating. The carrier 22 preferably has a thickness of 100 to 2000 μm, more preferably 300 to 1800 μm, further preferably 400 to 1100 μm. A thickness in such a range can ensure an appropriate toughness that does not preclude handling of the carrier 22 while achieving thinning of a printed circuit board and a reduction in warpage of the carrier 22 during packaging of an electronic component(s).

One side, adjacent to the adhesive metal layer 24, of the carrier 22 preferably has an arithmetic average roughness Ra of 0.1 to 15 nm, more preferably 0.5 to 12 nm, further preferably 1.0 to 10 nm, particularly preferably 1.5 to 7.5 nm, most preferably 2.0 to 5.0 nm, as measured in accordance with JIS B 0601-2001. As the average roughness decreases, the two sides of the extremely thin copper foil 10 also preferably has decreased arithmetic average roughnesses Ra. A printed circuit board produced from the extremely thin copper foil 10 or the extremely thin copper foil with the carrier 20 is more suitable for formation of a highly fine wiring pattern having a line/space (LS) of 10 μm or less/10 μm or less (for example, 10 μm/10 μm to 2 μm/2 μm). The arithmetic average roughness Ra may have any lower limit, for example, may be zero. In view of efficient planarization of the carrier 22, an approximate indication of the lower limit of the arithmetic average roughness Ra is 0.1 nm.

The adhesive metal layer 24 intervenes between the carrier 22 and the release layer 26 and contributes to tight adhesion between the carrier 22 and the release layer 26. The adhesive metal layer 24 is composed of at least one metal selected from the group consisting of Ti, Cr, Mo, Mn, W, and Ni. The adhesive metal layer 24 may be composed of a single metal or an alloy. The metal constituting the adhesive metal layer 24 may contain incidental impurities originated from, for example, components contained in a material and formed during a process for formation of the layer. After formation and subsequent exposure of the adhesive metal layer 24 to air, atmospheric oxygen may be trapped into the adhesive metal layer 24. The adhesive metal layer 24 is preferably formed by a gas-phase process, for example, a sputtering process. A particularly preferred adhesive metal layer 24 is formed with a metal target by a magnetron sputtering process because the adhesive metal layer 24 can have a further uniform thickness. The adhesive metal layer 24 preferably has a thickness of 5 to 500 nm, more preferably 10 to 300 nm, further preferably 18 to 200 nm, particularly preferably 20 to 100 nm. The thickness is determined by observation of the cross-section of the adhesive metal layer 24 with a transmission electron microscope provided with an energy dispersive X-ray spectroscopic analyzer (TEM-EDX).

The release layer 26 enables release of the carrier 22 provided with the adhesive metal layer 24. The release layer 26 is preferably composed of a carbon layer because the carbon layer can be readily formed and has high release effects. The carbon layer is preferably composed mainly of carbon or hydrocarbon, further preferably hard carbon or amorphous carbon. In this case, the carbon content of the release layer 26 (or carbon layer) is preferably at least 60 atom %, more preferably at least 70 atom %, further preferably at least 80 atom %, particularly preferably at least 85 atom %, as measured by X-ray photoelectron spectroscopy (XPS). The carbon content may have any upper limit, for example, may be 100 atom % and is practically 98 atom % or less. The release layer 26 (or carbon layer) may contain incidental impurities (for example, oxygen, carbon, and hydrogen deriving from an ambient environment, such as an atmosphere). Metal atoms (particularly copper atoms) originated from a formation process of the second extremely thin copper layer 16 may be trapped into the release layer 26 (or carbon layer). Carbon is less diffusible to and less reactive with the carrier. Even during a high-temperature press process above 300° C., the release layer 26 can prevent formation of a metallic bond between the copper foil and a bonded interface and keep the carrier readily releasable. A preferred release layer 26 is also formed by a gas-phase process, for example, a sputtering process to avoid trapping of excess incidental impurities in amorphous carbon and to keep continuous formation of the adhesive metal layer 24 as described above. The release layer 26 preferably has a thickness of 1 to 20 nm, more preferably 1 to 10 nm. The thickness is determined by observation of the cross-section of the release layer 26 with a transmission electron microscope provided with an energy dispersive X-ray spectroscopic analyzer (TEM-EDX).

When the carrier 22 is released together with the adhesive metal layer 24, the proportion of the amount of the release layer 26 remaining on the surface of the extremely thin copper foil 10 to the amount of the release layer 26 remaining on the surface, adjacent to the release layer 26, of the combination of the carrier 22 and the adhesive metal layer 24 that has been released is preferably 50% or less, more preferably 30% or less, further preferably 15% or less. Thus, a photoresist can come into close contact with the extremely thin copper foil 10. A finer circuit pattern that has a line/space (L/S) of 10 μm or less/10 μm or less can be formed with higher accuracy. The proportion of the amount of the release layer 26 remaining on the surface of the extremely thin copper foil 10 to the amount of the release layer 26 remaining on the surface, adjacent to the release layer 26, of the combination of the carrier 22 and the adhesive metal layer 24 may have any lower limit, for example, may be 0% (in other words, the release layer 26 does not remain on the surface, adjacent to the release layer 26, of the extremely thin copper foil 10) and is practically 1% or more. The amounts of the release layer 26 and the proportion can be determined by Raman spectroscopy, preferably under the conditions described below. In order to remove, for example, peaks generated from components other than that of the release layer 26 and noises, it is preferred that a first laminate sample and a second laminate sample be separately prepared. The first laminate sample includes the carrier 22 and the adhesive metal layer 24 (the release layer 26 and the other layers thereon are not formed). The second laminate sample includes the carrier 22, the adhesive metal layer 24, the release layer 26, and the second extremely thin copper layer 16 (the etching stopper layer 14 and the other layers thereon are not formed). The amount of the release layer 26 remaining on each of the adhesive metal layer 24 of the first laminate sample and the second extremely thin copper layer 16 of the second laminate is observed with the Raman spectrometer. Observed Raman spectra are preferably used as backgrounds as required.

<Conditions of Measurement>

Figure 5:
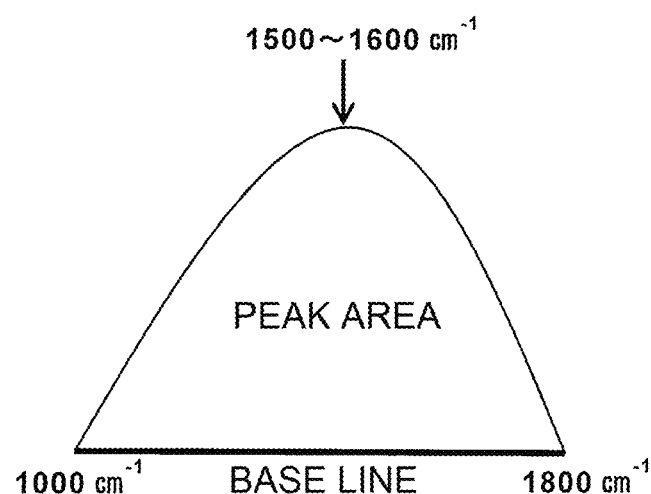
FIG. 5 is a schematic view illustrating a base line and a peak area of a Raman spectrum.
Figure 6:
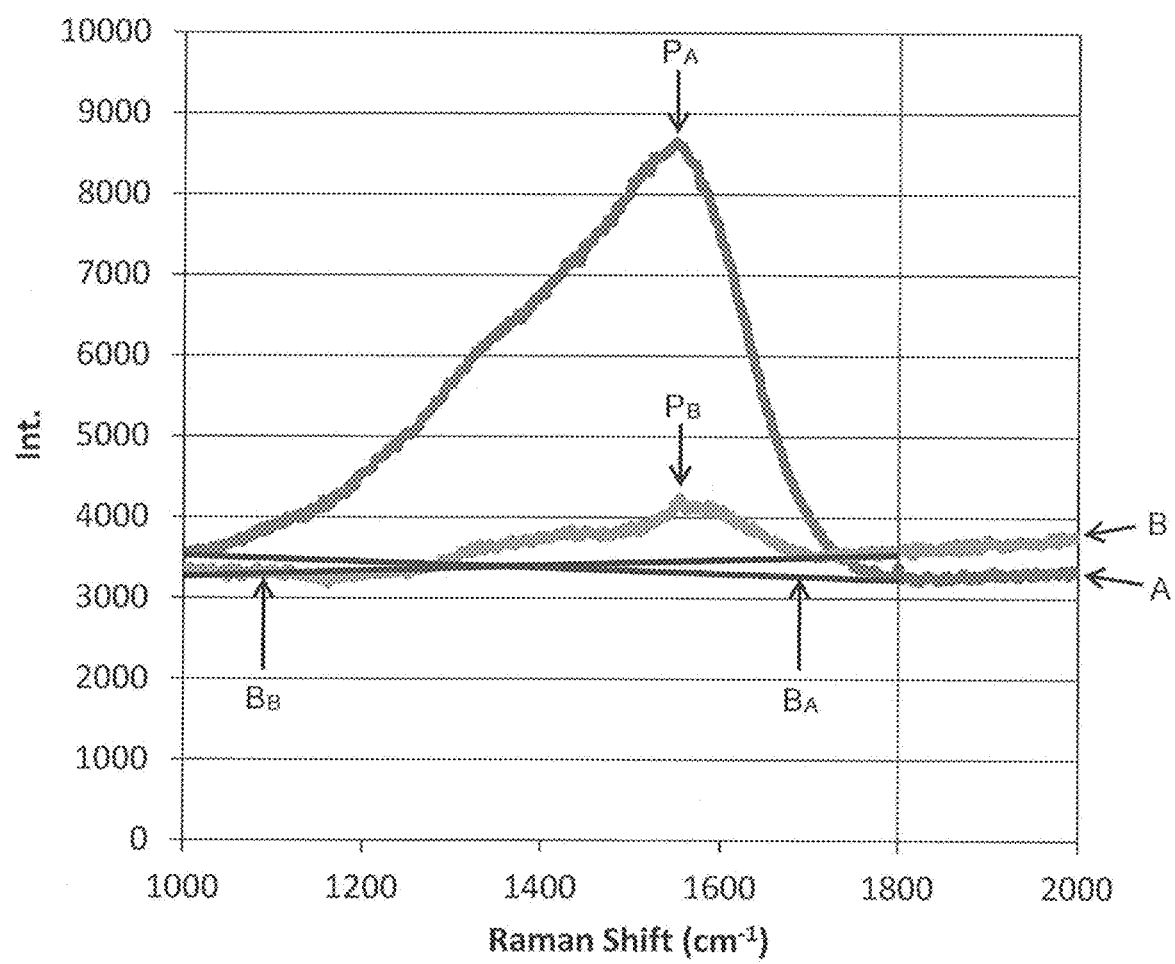
FIG. 6 indicates a Raman spectrum A and a Raman spectrum B after release of the carrier together with an adhesive metal layer. The Raman spectrum A is observed on a surface, adjacent to a release layer, of the combination of the carrier and the adhesive metal layer. The Raman spectrum B is observed on a surface, adjacent to the release layer, of the extremely thin copper foil.

Device: Laser Raman Spectrometer NRS-5200 available from JASCO Corporation
Exciting Wavelength: 532.29 nm
Grating: 600 lines/mm
Width of Slit: 200×1000 μm
Diameter of Aperture: 4000 μm
Object Lens: MPLFLN, 100×
Time of Exposure: 60 seconds Carbon typically has a peak between 1500 cm$^{-1}$ and 1600 cm$^{-1}$ in a Raman spectrum. Thus, this peak is assigned to the release layer 26. The surface, adjacent to the release layer 26, of the combination of carrier 22 and the adhesive metal layer 24 that has been released and the surface of the release layer 26, of the extremely thin copper foil 10 are observed using the peak between 1500 cm$^{-1}$ and 1600 cm$^{-1}$ in the Raman spectrum. The areas of the peaks (the areas of peak intensities) are compared for determination of the proportion. As schematically illustrated in FIG. 5, the phrase "the area of the peak between 1500 cm$^{-1}$ and 1600 cm$^{-1}$" in this context refers to the area of a region surrounded by a base line drawn between 1000 cm$^{-1}$ and 1800 cm$^{-1}$ and the profile of the Raman spectrum having a peak between 1500 cm$^{-1}$ and 1600 cm$^{-1}$, unless there are special circumstances. FIG. 6 indicates a Raman spectrum A and a Raman spectrum B after the carrier 22 is released together with the adhesive metal layer 24. The Raman spectrum A is observed on the surface, adjacent to the release layer 26, of the combination of carrier 22 and the adhesive metal layer 24. The Raman spectrum B is observed on the surface, adjacent to the release layer 26, of the extremely thin copper foil 10. In FIG. 6, a reference numeral $B_A$ indicates a base line of the spectrum A and a reference numeral $B_B$ indicates a base line of the spectrum B. As illustrated in FIG. 6, the area $A_A$ of the peak ($P_A$) of the Raman spectrum A is calculated, where the peak ($P_A$) lies between 1500 cm$^{-1}$ to 1600 cm$^{-1}$ and is observed on the surface, adjacent to the release layer 26, of the combination of carrier 22 and the adhesive metal layer 24. The area $A_B$ of the peak ($P_B$) of the Raman spectrum B is calculated, where the peak ($P_B$) lies between 1500 cm$^{-1}$ to 1600 cm$^{-1}$ and is observed on the release layer-side surface of the extremely thin copper foil 10. A percentage of the area $A_B$ to the area $A_A$ is calculated by an expression $(A_B/A_A)\times 100(\%)$. It is thereby possible to determine the proportion of the amount of the release layer 26 remaining on the surface of the extremely thin copper foil 10 to the amount of the release layer 26 remaining on the surface, adjacent to the release layer 26, of the combination of carrier 22 and the adhesive metal layer 24 after release of the combination of the carrier 22 and the adhesive metal layer 24.

The first extremely thin copper layer 12, the etching stopper layer 14, the second extremely thin copper layer 16, the release layer 26, and the adhesive metal layer 24 are preferably sputtered films or formed by a sputtering process. Formation of all the first extremely thin copper layer 12, the etching stopper layer 14, the second extremely thin copper layer 16, the release layer 26, and the adhesive metal layer 24 by the sputtering process significantly enhances production efficiency. The sputtering process commonly involves formation of a film with a highly pure target in vacuum. Thus, two sides of the extremely thin copper foil 10 can be kept in a clean state with a significantly low level of impurities. As a result, close contact can be achieved between a photoresist and the extremely thin copper foil 10 during formation of a circuit pattern. Since a significant planarity of the glass or ceramic carrier 22 can be inherited by each layer, a low arithmetic average roughness Ra of 20 nm or less can be achieved on the two sides of the extremely thin copper foil 10, resulting in more precise formation of a finer circuit pattern having a line/space (LS) of 10 μm or less/10 μm or less with a photoresist.

Method of Producing Extremely Thin Copper Foil with Carrier

The adhesive metal layer 24, the release layer 26, the second extremely thin copper layer 16, the etching stopper layer 14, and the first extremely thin copper layer 12 are formed on the abovementioned carrier 22. The extremely thin copper foil with the carrier 20 can thereby be produced. Each of the adhesive metal layer 24, the release layer 26, the second extremely thin copper layer 16, the etching stopper layer 14, and the first extremely thin copper layer 12 is preferably formed by a gas-phase process from the viewpoint of production of fine-pitch circuit patterns through thinning of the copper foil. Examples of the gas-phase process include sputtering, vacuum vapor deposition, and ion plating. The sputtering process is most preferred from the viewpoint of, for example, control of the thickness of a film in a wide range, such as 0.05 nm to 5000 nm, and ensuring a uniform thickness of the film over a large width or area. In particular, formation of all the adhesive metal layer 24, the release layer 26, the second extremely thin copper layer 16, the etching stopper layer 14, and the first extremely thin copper layer 12 by the sputtering process significantly enhances production efficiency. The sputtering process commonly involves formation of a film with a highly pure target in vacuum. Thus, two sides of the extremely thin copper foil 10 can be kept in a clean state with a significantly low level of impurities. As a result, close contact can be achieved between a photoresist and the extremely thin copper foil 10 during formation of a circuit pattern. Since a significant planarity of the glass or ceramic carrier 22 can be inherited by each layer, a low arithmetic average roughness Ra of 20 nm or less can be achieved on the two sides of the extremely thin copper foil 10, resulting in more precise formation of a finer circuit pattern having a line/space (US) of 10 µm or less/10 µm or less with a photoresist.

The film may be formed by any gas-phase process with a known vapor deposition system under known conditions. For example, any known sputtering process, such as magnetron sputtering, two-electrode sputtering, or facing targets sputtering, may be employed. The magnetron sputtering is preferred because it has a high film-forming rate and a high productivity. The sputtering process may be performed with either direct-current (DC) power or radio-frequency (RF) power. The target may be, for example, a well-known plate target. From the viewpoint of efficiency of use, a cylindrical target is preferably used. The formation of the adhesive metal layer 24, the release layer 26, the second extremely thin copper layer 16, the etching stopper layer 14, and the first extremely thin copper layer 12 by a gas-phase process (preferably by a sputtering process) will now be described.

The adhesive metal layer 24 is preferably formed with a target composed of at least one metal selected from the group consisting of Ti, Cr, Mo. Mn, W, and Ni by a gas-phase process involving magnetron sputtering under a non-oxidizing atmosphere because the adhesive metal layer 24 has a highly uniform thickness. The target preferably has a purity of 99.9% or more. The gas used in the sputtering process is preferably an inert gas, for example, gaseous argon. The flow rate of the gaseous argon may be appropriately determined depending on the volume of a sputtering chamber and process conditions for formation of the layer. A pressure ranging from 0.1 to 20 Pa is preferably applied during formation of the layer to keep continuous formation of the layer without operational failure of the vapor deposition system, such as abnormal electric discharge or defective plasma radiation. The pressure range may be determined by adjustments of the power for formation of the layer and the flow rate of the gaseous argon depending on, for example, the structure and capacity of the system, the evacuation capacity of the vacuum pump, and the rating capacity of the power for formation of the layer. The sputtering power may be appropriately determined within a range of 0.05 to 10.0 W/cm$^2$ per unit area of the target in view of, for example, the uniformity of the thickness of the layer and the productivity of formation of the layer.

The carbon or release layer 26 is preferably formed by a gas-phase process (preferably a sputtering process) with a carbon target under an inert atmosphere, for example, an argon atmosphere. The carbon target is preferably composed of graphite that may contain incidental impurities (for example, oxygen and carbon deriving from an ambient environment, such as an atmosphere). The carbon target preferably has a purity of at least 99.99%, more preferably at least 99.999%. A pressure ranging from 0.1 to 2.0 Pa is preferably applied during formation of the layer to keep continuous formation of the layer without operational failure of the vapor deposition system, such as abnormal electric discharge or defective plasma radiation. The pressure range may be determined by adjustments of the power for formation of the layer and the flow rate of the gaseous argon depending on, for example, the structure and capacity of the system, the evacuation capacity of the vacuum pump, and the rating capacity of the power for formation of the layer. The sputtering power may be appropriately determined within a range of 0.05 to 10.0 W/cm$^2$ per unit area of the target in view of, for example, the uniformity of the thickness of the layer and the productivity of formation of the layer.

The second extremely thin copper layer 16 is preferably formed by a gas-phase process (preferably a sputtering process) with a copper target under an inert atmosphere, for example, an argon atmosphere. The copper target is preferably composed of elemental copper that may contain incidental impurities. The copper target preferably has a purity of at least 99.9%, more preferably at least 99.99%, further preferably at least 99.999%. In order to prevent an increase in temperature during the formation of the second extremely thin copper layer 16 in the gas-phase sputtering process, a mechanism may be provided for cooling the stage in the vapor deposition system. A pressure ranging from 0.1 to 2.0 Pa is preferably applied during the formation of the layer to keep continuous formation of the layer without operational failure of the vapor deposition system, such as abnormal electric discharge or defective plasma radiation. The pressure range may be determined by adjustments of the power for formation of the layer and the flow rate of the gaseous argon depending on, for example, the structure and capacity of the system, the evacuation capacity of the vacuum pump, and the rating capacity of the power for formation of the layer. The sputtering power may be appropriately determined within a range of 0.05 to 10.0 W/cm$^2$ per unit area of the target in view of, for example, the uniformity of the thickness of the layer and the productivity of formation of the layer.

The etching stopper layer 14 is preferably formed by a magnetron sputtering process with a target composed of at least one metal selected from the group consisting of Cr, W, Ta, Co, T, Ag, Ni, and Mo. The target preferably has a purity of 99.9% or more. In particular, the etching stopper layer 14 is preferably formed by the magnetron sputtering process under an inert atmosphere, for example, an argon atmosphere and a pressure of 0.1 to 20 Pa. The sputtering pressure is more preferably 0.2 to 15 Pa, further preferably 0.3 to 10 Pa. The pressure range may be determined by adjustments of the power for formation of the layer and the flow rate of the gaseous argon depending on, for example, the structure and capacity of the system, the evacuation capacity of the vacuum pump, and the rating capacity of the power for formation of the layer. Any flow rate of the gaseous argon may be appropriately determined depending on the volume of the sputtering chamber and the process conditions for formation of the layer. The sputtering power may be appropriately determined within a range of 1.0 to 15.0 W/cm$^2$ per unit area of the target in view of, for example, the uniformity of the thickness of the layer and the productivity of formation of the layer. The temperature of the carrier is preferably kept constant during formation of the layer for achievement of uniform properties of the layer (for example, the uniform resistance and crystal size of the layer). The temperature of the carrier during formation of the layer is preferably adjusted within a range of 25 to 300° C., more preferably 40 to 200° C., further preferably 50 to 150° C.

The first extremely thin copper layer 12 is preferably formed by a gas-phase process (preferably a sputtering process) with a copper target under an inert atmosphere, for example, an argon atmosphere as in the formation of the second extremely thin copper layer 16. Thus, the process conditions described with respect to formation of the second extremely thin copper layer 16 apply to the formation of the first extremely thin copper layer 12.

Laminate for Printed Circuit Board

The extremely thin copper foil with the carrier according to the present invention may be provided in the form of a laminate for a printed circuit board. In other words, a laminate for printed circuit board, including the extremely thin copper foil with the carrier is provided according to a preferred embodiment of the invention. The laminates for printed circuit boards are categorized into two types: (i) A first type of laminate for a printed circuit board is the extremely thin copper foil with the carrier itself. In other words, the first type of laminate has the same structure as the extremely thin copper foil 10 with the carrier, provided with, in sequence, the adhesive metal layer 24, the release layer 26, the second extremely thin copper layer 16, the etching stopper layer 14, and the first extremely thin copper layer 12 on at least one side of the carrier 22. Alternatively, the first type of laminate may have a structure provided with, in sequence, the adhesive metal layer 24, the release layer 26, the second extremely thin copper layer 16, the etching stopper layer 14, and the first extremely thin copper layer 12 on two sides of the carrier. The first type of laminate can be achieved if the carrier 22 itself, for example, in the form of a glass plate or a ceramic plate, has high rigidity and can function as a support. For example, a glass carrier 22 has a low weight, a low coefficient of thermal expansion, high rigidity, and surface planarity and thus is advantageous in that two sides of the extremely thin copper foil 10 can be significantly planarized. (ii) A second type of laminate for a printed circuit board is provided with an adhesive layer remote from the adhesive metal layer 24 on the carrier 22 or on the outer surface of the carrier 22. Examples of such an adhesive layer include resin layers and fiber-reinforced (for example, glass) prepreg. For example, a possible layered structure includes the first extremely thin copper layer 12, the etching stopper layer 14, the second extremely thin copper layer 16, the release layer 26, the adhesive metal layer 24, the carrier 22, the adhesive layer (not shown), the carrier 22, the adhesive metal layer 24, the release layer 26, the second extremely thin copper layer 16, the etching stopper layer 14, and the first extremely thin copper layer 12.

Method of Producing Printed Circuit Board

The extremely thin copper foil with the carrier according to the present invention can be used for production of a printed circuit board. A preferred method of producing a printed circuit board will now be described. The method of producing a printed circuit board includes the steps of (1) providing an extremely thin copper foil with a carrier; (2) forming a first circuit pattern; (3) sealing the first circuit pattern; (4) releasing the carrier; (5) forming a second circuit pattern; and (6) sealing the second circuit pattern. FIGS. 3 and 4 schematically illustrate the method of producing the printed circuit board, including these steps.

(1) Step for Providing Extremely Thin Copper Foil with Carrier

The extremely thin copper foil with the carrier 20 is provided as a support (see FIG. 3 (a)). As described above, the extremely thin copper foil with the carrier 20 may be provided in the form of a laminate for a printed circuit board, as produced. Alternatively, the extremely thin copper foil with the carrier 20 may be provided having a layered structure including the adhesive layer remote from the adhesive metal layer 24 on the carrier 22 or on the outer surface of the carrier 22 (for example, a layered structure including the first extremely thin copper layer 12, the etching stopper layer 14, the second extremely thin copper layer 16, the release layer 26, the adhesive metal layer 24, the carrier 22, the adhesive layer, the carrier 22, the adhesive metal layer 24, the release layer 26, the second extremely thin copper layer 16, the etching stopper layer 14, and the first extremely thin copper layer 12).

(2) Steps of Forming First Circuit Pattern

The first extremely thin copper layer 12 is processed into a predetermined pattern for formation of the first circuit pattern 13 (see FIG. 3 (b)). The first circuit pattern 13 may be formed by any known process but is preferably formed as described in the following Steps (2a) to (2d).

(2a) Step of Forming Photoresist

A photoresist layer having a predetermined pattern is formed on the first extremely thin copper layer 12. The photoresist layer is preferably a photosensitive film, for example, a photosensitive dry film. The photoresist layer may be given a predetermined pattern by exposure and development.

(2b) Step of Forming Electroplated Copper Layer

An electroplated copper layer is formed on an exposed area (in other words, a portion unmasked by the photoresist layer) of the first extremely thin copper layer 12. Electroplating of copper may be performed by any known process.

(2c) Step of Releasing Photoresist Layer

The photoresist layer is then stripped. As a result, the electroplated copper layer remains in the form of a wiring pattern and the area, having no wiring pattern, of the first extremely thin copper layer 12 is exposed.

(2d) Step of Copper Flash Etching

Unnecessary portions of the first extremely thin copper layer 12 are removed by copper flash etching for exposure of the etching stopper layer 14. The first circuit pattern 13 is formed thereby. A preferred copper flash etching solution is at least one of sulfuric acid/hydrogen peroxide mixed solution, aqueous sodium persulfate solution, and aqueous potassium persulfate solution in order that the first exposed extremely thin copper layer 12 can be certainly etched while excess etching of the electroplated copper layer can be avoided. The electroplated copper layer and the first extremely thin copper layer 12 remain in the form of a wiring pattern. The portion, having no wiring pattern, of the etching stopper layer is not dissolved in the copper flash etching solution and is exposed. The etching stopper layer 14, which is composed of at least one metal selected from the group consisting of Cr, W, Ta, Co, Ti, Ag, Ni, and Mo, is insoluble in the copper flash etching solution and thus exhibits high chemical resistance against the copper flash etching solution. In other words, the etching stopper layer 14 remains exposed without being removed by the copper flash etching solution and prevents the etching solution from corroding the second extremely thin copper layer 16 remote from the first extremely thin copper layer 12.

(3) Step of Sealing First Circuit Pattern

The first circuit pattern 13 is sealed with an insulating resin 28 (see FIG. 3 (c)). Any known process may be employed for sealing of the first circuit pattern 13 with the insulating resin.

(4) Step of Releasing Carrier

The carrier 22 is released together with the adhesive metal layer 24 and the release layer 26 from the laminate on which the first circuit pattern 13 is sealed with the insulating resin 28. The second extremely thin copper layer 16 is thereby exposed (see FIG. 4 (d)). Although the carrier 22 may be released by any technique, for example, physical separation or chemical separation, the physical separation is preferred. The physical separation is a technique that releases the carrier 22 from the laminate by hand or with a tool or a machine. The extremely thin copper foil with the carrier 20 according to the present invention includes the adhesive metal layer 24. The carrier 22 thus has high stability of mechanical release strength. As a result, the carrier 22 can be readily released together with the adhesive metal layer 24 and the release layer 26. This is because the adhesion between the release layer 26 and the second extremely thin copper layer 16 is lower than the adhesion, achieved by the intervening adhesive metal layer 24, between the carrier 22 and the release layer 26.

(5) Step of Forming Second Circuit Pattern

The second extremely thin copper layer 16 and then the etching stopper layer 14 are processed to form the second circuit pattern 17 (see FIG. 4 (e)). Although the laminate no longer retains the carrier 22 and include no traditional silicon or glass interposer exhibiting high rigidity, the preferred rigidity of the laminate can be achieved by the first circuit pattern 13 sealed with the insulating resin 28 (as if the laminate was a resin substrate). Thus, the laminate can advantageously form the second circuit pattern 17 (particularly, a fine circuit pattern) and mount an IC chip 30 to be described below while the laminate can certainly maintain its flat shape. Such a stable flat shape of the laminate not only enables a fine circuit pattern to be precisely formed but also the production yield to increase because the formed circuit pattern is barely damaged during mount of the IC chip 30.

The second extremely thin copper layer 16 may be processed for formation of the second circuit pattern 17 according to (2) Step of Forming First Circuit Pattern.

Processing of the etching stopper layer 14 for formation of the second circuit pattern 17 preferably involves removal of an unnecessary portion (typically an exposed portion) of the etching stopper layer 14 by flash etching. In this way, the etching stopper layer 14 is formed into the same wiring pattern as the second extremely thin copper layer 16 that has been already processed by flash etching. An appropriate etching solution is preferably selected, for example, from ones listed in Table 1, for flash etching depending on the constituent element of the etching stopper layer 14. Although typical examples are listed in Table 1, any other etching solution may also be used. The types, contents, and temperatures of acids and ammonium salts described in Table 1 may be appropriately modified.

TABLE 1

| Constituent Element of Etching Stopper Layer | Preferred Formulation of Etching Solution | Preferred Temperature |
|---|---|---|
| Cr | $HNO_3$ (5%) and CAN (ammonium hexanitratocerate(IV)) (20%) | 40° C. |
| W | $H_2O_2$ (30%), triammonium citrate (5%), and $NH_3$ (0.1%) | 30° C. |
| Ta | NaOH (30%) | 70 to 80° C. |
| Co | $HNO_3$ (20%), and $H_2O_2$ (10%) | 40° C. |
| Ti | $H_2O_2$ (30%), triammonium citrate (5%), and $NH_3$ (0.1%) | 30° C. |
| Ag | $HNO_3$ (50 to 90%) | 38 to 50° C. |
| Ni | $HNO_3$ (20%) and $H_2O_2$ (10%) | 40° C. |
| Mo | $H_3PO_4$, $HNO_3$, and $CH_3COOH$ | 23° C. |

Since the etching stopper layer 14 can be selectively flash-etched with such etching solutions, only the unnecessary portion of the etching stopper layer 14 can be selectively removed without corrosion of the first circuit pattern 13 and the second circuit pattern 17 (these are composed of copper). In other words, a highly selective etching solution can be used for flash etching of the etching stopper layer 14 composed of at least one metal selected from the group consisting of Cr, W, Ta, Co, Ti, Ag, Ni, and Mo. As a result, corrosion of copper constituting the first circuit pattern 13 and the second circuit pattern 17 by an etching solution can be inhibited or avoided.

Preferably, the step of forming the second circuit pattern 17 further involves mounting the IC chip 30 (see FIG. 4(e)). Throughout the specification, the term "integrated circuits (ICs)" broadly include various integrated circuits, such as central processing units (CPU), digital signal processors (DSP), memories, power management integrated circuits (PMIC), radiofrequency integrated circuits (RFIC, for example, global positioning systems (GPS)). The IC chip 30 may be mounted on the first circuit pattern 13 or the second circuit pattern 17 but preferably on the first circuit pattern 13. If the IC chip 30 is mounted on the first circuit pattern 13, the IC chip 30 is preferably disposed in the area, exposed by etching of the second extremely thin copper layer 16 and the etching stopper layer 14, of the first circuit pattern 13. Examples of techniques for mount of IC chips include flip chip mounting processes and die bonding processes. A flip chip mounting process joins mount pads on the IC chip 30 with the first circuit pattern 13 or the second circuit pattern 17. For example, pillar electrodes or bumps may be formed on the mount pads. A sealing resin film or a non-conductive film (NCF) may be bonded onto the first circuit pattern 13 or the second circuit pattern 17 before the mount of the IC chip 30. Joint may be preferably carried out with a metal having a low melting point, for example, a solder. Alternatively, the joint may be carried out with an anisotropic conductive film. In contrast, a die bonding process bonds a surface, remote from the mount pads, of the IC chip 30 to the first circuit pattern 13 or the second circuit pattern 17. A paste or film composed of a resin composition containing a thermosetting resin and an inorganic filler is preferably used in the die bonding process.

(6) Step of Sealing Second Circuit Pattern

The second circuit pattern 17, which is formed by processing of the second extremely thin copper layer 16, is sealed with the insulating resin 28 for finishing of a printed circuit board 32 (see FIG. 4 (f)). The second circuit pattern 17 may be sealed with the insulating resin 28 by any known technique.

An outer layer of the printed circuit board 32 illustrated in FIG. 4 (f) can be processed by any technique. For example, a solder resist layer may be formed on the first circuit pattern 13 and/or the second circuit pattern 17 of the printed circuit board 32 and subjected to a surface treatment, for example, a Ni—Au plating process or an organic solderability preservative (OSP or water-soluble preflux) process for formation of an outer-layer pad. The outer-layer pad may be provided with, for example, a pillar. Alternatively, the outer layer may be appropriately processed by any other known technique that has been commonly employed for production of a printed circuit board.

The invention claimed is:

1. An copper foil comprising, in sequence:
   a first copper layer;
   an etching stopper layer; and
   a second copper layer,
   wherein:
   two sides of the copper foil each have an arithmetic average roughness Ra of 20 nm or less;
   the first copper layer and the second copper layer each has a thickness of 0.05 to 1 μm;
   the etching stopper layer has a thickness of 0.05 to 1.0 μm; and the etching stopper layer is positioned between the first copper layer and the second copper layer.

2. The copper foil according to claim 1, wherein the etching stopper layer is composed of at least one metal selected from the group consisting of Al, Nb, Zr, Cr, W, Ta, Co, Ti, Ag, Ni, and Mo.

3. The copper foil according to claim 1, wherein the copper foil has a thickness of 0.15 to 3.0 µm.

4. The copper foil according to claim 1, wherein the two sides of the copper foil each have an arithmetic average roughness Ra of 0.1 to 20 nm.

5. The copper foil according to claim 1, wherein the first copper layer, the etching stopper layer, and the second copper layer are sputtered films.

6. A copper foil with a carrier, comprising:
  a carrier composed of glass or ceramic;
  an adhesive metal layer provided on the carrier, the adhesive metal layer being composed of at least one metal selected from the group consisting of Ti, Cr, Mo, Mn, W, and Ni;
  a release layer provided on the adhesive metal layer, the release layer composed of a carbon layer; and
  the copper foil according to claim 1 provided on the release layer, wherein the second copper layer is in contact with the release layer.

7. The copper foil with the carrier according to claim 6, wherein the carrier is composed of glass.

8. The copper foil with the carrier according to claim 7, wherein the adhesive metal layer has a thickness of 5 to 500 nm.

9. The copper foil with the carrier according to claim 7, wherein the release layer has a thickness of 1 to 20 nm.

10. The copper foil with the carrier according to claim 7, wherein when the carrier is released together with the adhesive metal layer, a proportion of an amount of the release layer remaining on a surface of the copper foil to an amount of the release layer remaining on a surface, adjacent to the release layer, of a combination of the carrier and the adhesive metal layer that has been released is 50% or less, the amount being determined by Raman spectroscopy.

11. The copper foil with the carrier according to claim 7, wherein the first copper layer, the etching stopper layer, the second copper layer, the release layer, and the adhesive metal layer are sputtered films.

12. A method of producing a printed circuit board, comprising:
  providing the copper foil with the carrier according to claim 7;
  forming a first circuit pattern by processing the first copper layer;
  sealing the first circuit pattern with an insulating resin;
  releasing the carrier together with the adhesive metal layer and the release layer for exposure of the second copper layer;
  forming a second circuit pattern by processing the second copper layer and then processing the etching stopper layer; and
  sealing the second circuit pattern with an insulating resin.

13. The method according to claim 12, wherein forming the second circuit pattern further comprises mounting an IC chip.

* * * * *